(12) United States Patent
Huang et al.

(10) Patent No.: US 6,399,456 B2
(45) Date of Patent: *Jun. 4, 2002

(54) METHOD OF FABRICATING A RESISTOR AND A CAPACITOR ELECTRODE IN AN INTEGRATED CIRCUIT

(75) Inventors: Kuo-Liang Huang; I-Ho Huang, both of Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,323

(22) Filed: Dec. 1, 1998

(51) Int. Cl.$^7$ ................................................ H01L 21/20
(52) U.S. Cl. ...................... 438/385; 438/381; 438/382; 438/383; 438/384
(58) Field of Search ................................ 438/381, 382, 438/383, 384, 385

(56) References Cited

U.S. PATENT DOCUMENTS 5,500,387 A * 3/1996 Tung et al. .................... 437/60

OTHER PUBLICATIONS

Wolf et al., "Silicon Processing for the VLSI Era, vol. 1—Process Technology" 1986, pp 168, 323, 539, 556–557.*

* cited by examiner

Primary Examiner—John F. Niebling
Assistant Examiner—Jennifer M. Kennedy
(74) Attorney, Agent, or Firm—J.C. Patents

(57) ABSTRACT

A semiconductor fabrication method is provided for fabricating a resistor and a capacitor electrode in an integrated circuit, which can help enhance the quality of the resultant integrated circuit. In this method, the first step is to form a polysilicon layer. Then, optionally, a first oxide layer is formed over the polysilicon layer. Next, a first ion-implantation process is performed on the entire polysilicon layer so as to convert it into a lightly-doped polysilicon layer with a first predefined impurity concentration. After this, a second ion-implantation process is performed solely on the predefined electrode part of the polysilicon layer so as to convert this part into a heavily-doped polysilicon layer with a second predefined impurity concentration higher than the first impurity concentration. Subsequently, a selective removal process is performed to remove selected parts of the lightly-doped part and the heavily-doped part of the polysilicon layer. Then, optionally, a second oxide layer is formed in such a manner as to cover the entire remaining part of the lightly-doped polysilicon layer and the entire remaining part of the heavily-doped polysilicon layer. Finally, the silicon nitride layers and the second oxide layer are removed. The remaining part of the lightly-doped polysilicon layer serves as the intended resistor, while the remaining part of the heavily-doped polysilicon layer serves as the intended capacitor electrode.

12 Claims, 4 Drawing Sheets

METHOD OF FABRICATING A RESISTOR AND A CAPACITOR ELECTRODE IN AN INTEGRATED CIRCUIT

BACKGROUND OF THE INVENTION

1. Field of the Invention

This invention relates to semiconductor fabrication technology, and more particularly, to a method of fabricating a resistor and a capacitor electrode in an integrated circuit.

2. Description of Related Art

An integrated circuit includes various kinds of circuit components, such as bi-polar junction transistors (BJT), metal-oxide semiconductor (MOS) transistors, junction diodes, resistors, and capacitors, that are arranged in a particular manner to provide the desired functionality.

FIGS. 1A–1F are schematic, cross-sectional diagrams used to depict the steps involved in a conventional method for fabricating a resistor and a capacitor electrode in an integrated circuit. The resistor is to be connected to a MOS transistor, while the capacitor electrode is to be used as a bottom electrode for a capacitor connected to the MOS transistor.

Referring first to FIG. 1A, in the initial step, a semiconductor substrate 10 is prepared. The substrate 10 is formed with a P-well 16 and an N-well 18. Isolation structures 14 are formed at predefined locations over the substrate 10 to define a plurality of active regions 12. Furthermore, a layer of silicon nitride 20 is formed over each of the active regions 12.

Referring next to FIG. 1B, in the subsequent step, the silicon nitride layer 20 over each of the active regions 12 is removed through a wet-etching process. After this, a sacrificial oxide layer 22 is formed over the entire top surface of the wafer to a thickness of about 300 Å (angstrom). Subsequently, an ion-implantation process is performed to dope ionized boron difluoride at an energy of about 60 KeV (kiloelectronvolt) with a concentration of about $3.4 \times 10^{12}$ ions/cm$^2$ into the channel regions in the substrate 10. After this, an N-channel for depletion mode N-channel MOS (NMOS) is formed in the P-well 16 by performing an ion-implantation process to dope ionized phosphorous at an energy of about 60 KeV with a concentration of about $1.7 \times 10^{13}$ ions/cm$^2$ into the P-well 16.

Referring next to FIG. 1C, in the subsequent step, a photoresist layer 23 is coated over the wafer in such a manner as to mask the N-well 18 while unmasking the P-well 16. Then, with the photoresist layer 23 serving as mask, an ion-implantation process is performed on the wafer to dope ionized boron at an energy of 70 KeV with a concentration of $1.5 \times 10^{12}$ ions/cm$^2$ into the unmasked P-well 16. After this, the ion-implantation process is performed again to dope ionized boron at a higher energy of 180 KeV with a higher concentration of $8 \times 10^{12}$ ions/cm$^2$ into the unmasked P-well 16. Through these two ion-implantation processes, the P-well 16 is converted into a retrograde P-well in which the impurity concentration decreases with height. This gives the retrograde P-well 16 a high anti-punchthrough capability. After this, the entire photoresist layer 23 is removed.

Referring next to FIG. 1D, in the subsequent step, polysilicon layer 24 is formed over the sacrificial oxide layer 22 through a chemical-vapor deposition (CVD) process to a thickness of about 2,000 Å. Next, an ion-implantation process is performed to dope ionized phosphorous at an energy of about 50 KeV with a concentration of about $6 \times 10^{15}$ ions/cm$^2$ into the polysilicon layer 24.

Referring next to FIG. 1E, in the subsequent step, a photoresist layer 25 is coated over the wafer in such a manner as to mask the part of the polysilicon layer 24 (FIG. 1D) that lies directly above the P-well 16 and is to be formed by definition into a lightly-doped polysilicon region, as indicated by the reference numeral 28, while unmasking the part of the polysilicon layer 24 that is laid directly above the N-well 18 and is to be formed by definition into a heavily-doped polysilicon region, as indicated by the reference numeral 26. Then, with the photoresist layer 25 serving as mask, an ion-implantation process is performed to dope ionized phosphorous at an energy of about 50 KeV with a concentration of about $1.5 \times 10^{16}$ ions/cm$^2$ into the unmasked part of the polysilicon layer 24. After this, the entire photoresist layer 25 is removed. Subsequently, an annealing process is performed on the polysilicon layer 24 at a temperature of about 850° C. in a gaseous environment of argon or nitrogen.

Referring next to FIG. 1F, in the subsequent step, the entire polysilicon layer 24 (FIG. 1D) is selectively removed through a photolithographic and etching process. The remaining part of the lightly-doped part 28 of the polysilicon layer 24 over the isolation structure 14 in the P-well 16 serves as a resistor for the integrated circuit, whereas the remaining part of the heavily-doped part 26 of the polysilicon layer 24 over the isolation structure 14 in the N-well 18 serves as a bottom electrode for a capacitor (not shown) that is to be subsequently formed in the integrated circuit.

The foregoing method for fabricating the resistor and the capacitor electrode, however, has the following drawbacks.

First, since the photoresist layer 25 is used as mask in the high-concentration ion implantation, the subsequent removal of the entire photoresist layer 25 and the selected part of the polysilicon layer 24 may be incomplete.

Second, during the ion implantation on the polysilicon layer 24, the polysilicon layer 24 can be easily contaminated by the particles and metals from the implantation machine since the polysilicon layer 24 is exposed.

Third, despite the provision of the 300 Å sacrificial oxide layer 22 beneath the polysilicon layer 24, the underlying substrate 10 can nonetheless be easily damaged by the bombarding ions used in the ion-implantation process on the polysilicon layer 24 and by the plasma used in the selective etching process on the polysilicon layer 24.

All the foregoing drawbacks cause undesired decreases in the charge breakdown ($Q_{BD}$) and the breakdown voltage of gate oxide ($BV_{GOX}$) of the subsequently formed gate oxide layer over the substrate. The resultant gate oxide layer is therefore degraded in electrical characteristics.

SUMMARY OF THE INVENTION

It is therefore an objective of the present invention to provide a method for fabricating a resistor and a capacitor electrode in an integrated circuit which can help eliminate the above-mentioned drawbacks of the prior art so as to prevent the undesired decreases in the charge breakdown and the breakdown voltage of gate oxide of the subsequently formed gate oxide layer over the substrate.

In accordance with the foregoing and other objectives of the present invention, an improved method for fabricating a resistor and a capacitor electrode in an integrated circuit is provided.

The method of the invention is proposed for use on an integrated circuit constructed on a semiconductor substrate that is already formed with a plurality of isolation structures defining a plurality of active regions with a silicon nitride layer formed over each of the active regions. The method of the invention comprises a first step of forming a polysilicon layer covering all the isolation structures and the active regions, the polysilicon layer being partitioned by definition into a resistor part and a capacitor electrode part. Then, optionally, a first oxide layer is formed over the polysilicon layer. Next, a first ion-implantation process is performed on the entire polysilicon layer to convert the entire polysilicon layer into a lightly-doped polysilicon layer with a first predefined impurity concentration. Then, a second ion-implantation process is performed solely on the predefined electrode part of the polysilicon layer so as to convert the electrode part of the polysilicon layer into a heavily-doped polysilicon layer with a second predefined impurity concentration higher than the first impurity concentration. Subsequently, a selective removal process is performed to remove selected parts of the lightly-doped polysilicon layer and the heavily-doped polysilicon layer in such a manner as to expose all the silicon nitride layers. Then, optionally, a second oxide layer is formed in such a manner as to cover the entire remaining part of the lightly-doped polysilicon layer and the entire remaining part of the heavily-doped polysilicon layer. Finally, the silicon nitride layers and the second oxide layer are removed. The remaining part of the lightly-doped polysilicon layer serves as the intended resistor, while the remaining part of the heavily-doped polysilicon layer serves as the intended capacitor electrode.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the method according to the invention for fabricating a resistor and a capacitor electrode in an integrated circuit is depicted step by step in the following with reference to FIGS. 2A–2E.

Figure 1A:
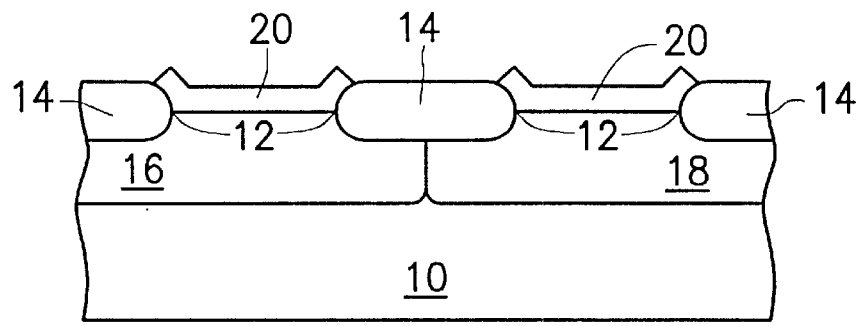
FIGS. 1A–1F are schematic, cross-sectional diagrams used to depict the steps involved in a conventional method for fabricating a resistor and a capacitor electrode in an integrated circuit.
Figure 1B:
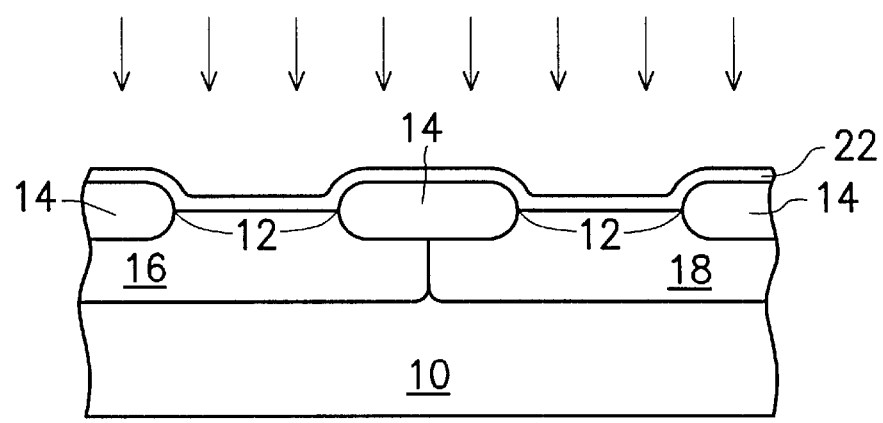
Figure 1C:
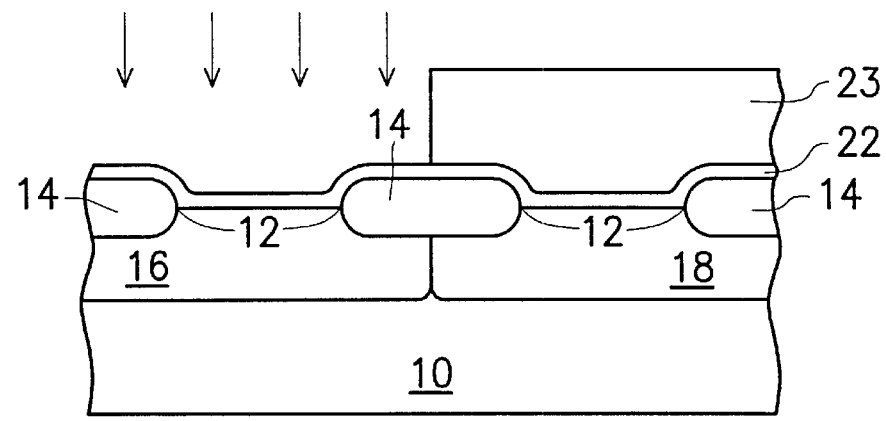
Figure 1D:
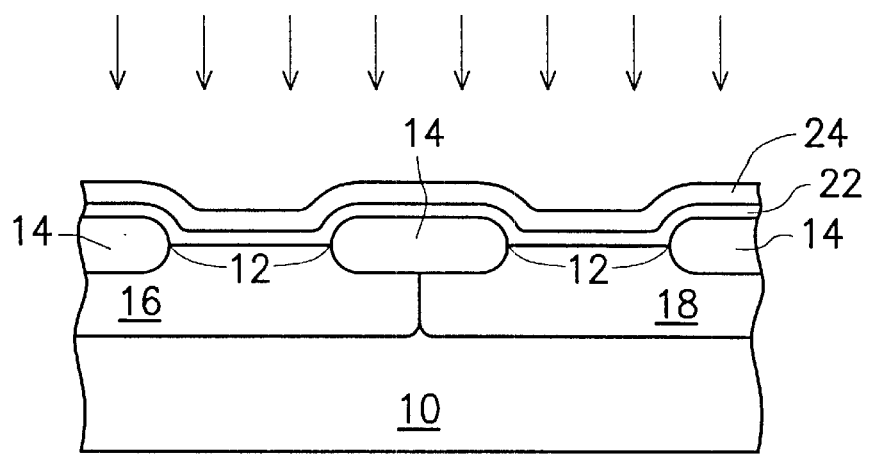
Figure 1E:
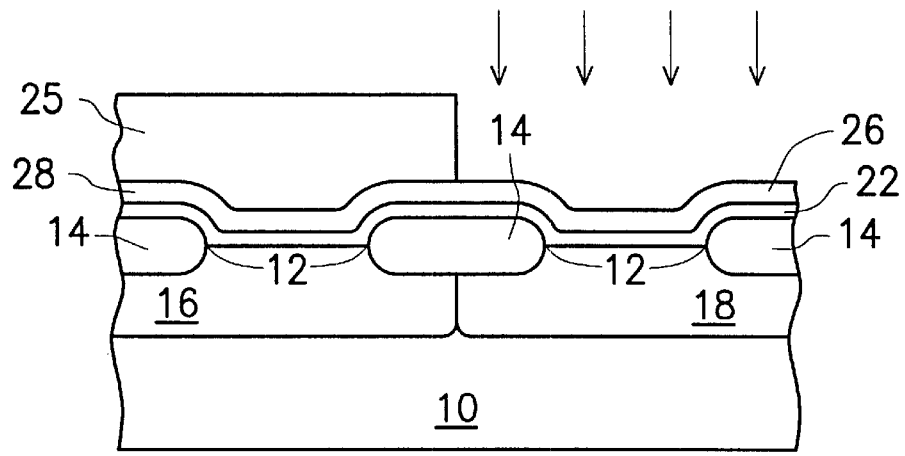
Figure 1F:
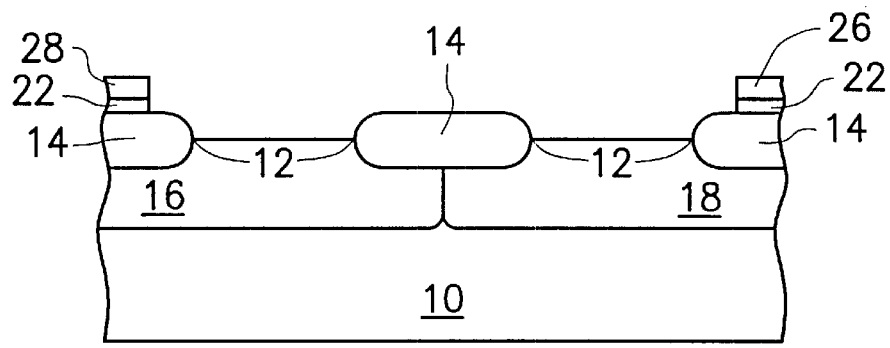
Figure 2A:
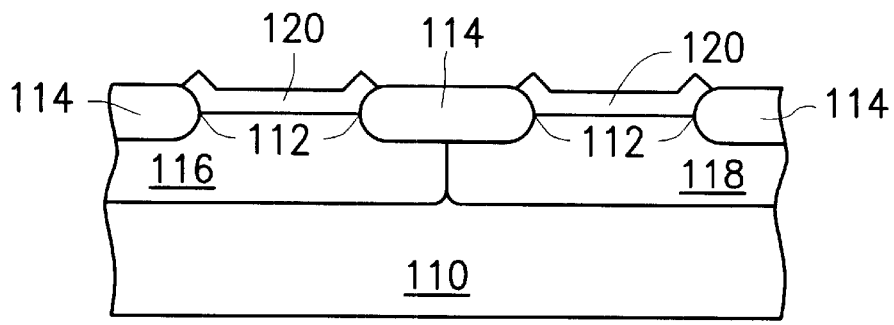
FIGS. 2A–2E are schematic, cross-sectional diagrams used to depict the steps involved in the method according to the invention for fabricating a resistor and a capacitor electrode in an integrated circuit.

Referring first to FIG. 2A, in the initial step, a semiconductor substrate 110 is prepared. The substrate 110 is formed with a P-well 116 and an N-well 118. Isolation structures 114 are formed at predefined locations over the substrate 110 to define a plurality of active regions 112. Furthermore, a layer of silicon nitride 120 is formed over each of the active regions 112.

Figure 2B:
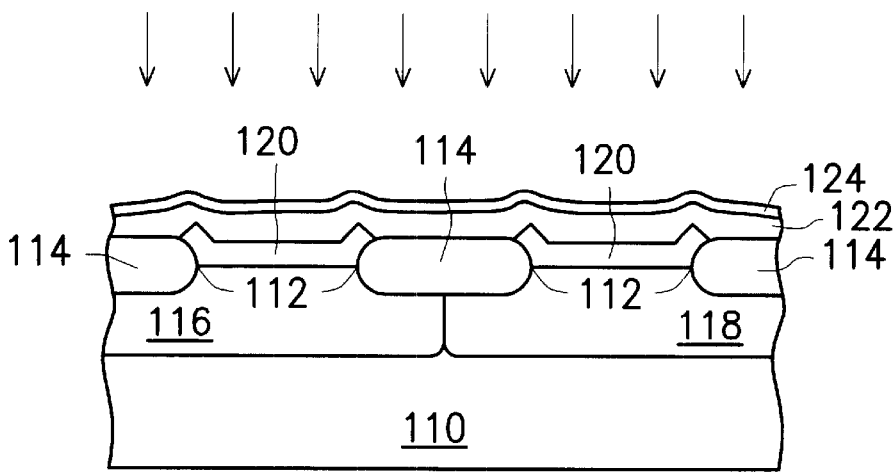

Referring next to FIG. 2B, in the subsequent step, a polysilicon layer 122 is formed over the entire top surface of the wafer, covering all of the silicon nitride layers 120 and the isolation structures 114. This polysilicon layer 122 can be formed, for example, through a low-pressure chemical-vapor deposition (LPCVD) process to a thickness of about 2,000 Å. Then, optionally, an oxide layer 124 can be formed over the polysilicon layer 122, preferably to a thickness of about 100 Å. The provision of this oxide layer 124 can help prevent the particles and metals from the implantation machine from contaminating the substrate 110 during the subsequent ion-implantation processes. After this, a first ion-implantation process is performed to dope ionized phosphorous at an energy of about 50 KeV with a concentration of about $6 \times 10^{15}$ ions/cm$^2$ into the entire polysilicon layer 122. By specification, this ion-implantation process is aimed to convert the polysilicon layer 122 so that it has the resistance of the intended resistor in the integrated circuit. A selected part of the same polysilicon layer 122 is doped again in the next step to further increase the conductivity thereof, so that this part can be used to serve as the intended capacitor electrode in the integrated circuit. In the case of this preferred embodiment, the left part of the polysilicon layer 122 above the P-well 116 is be used to form the intended resistor, whereas the right part of the polysilicon layer 122 above the N-well 118 is be used to form the intended capacitor.

Figure 2C:
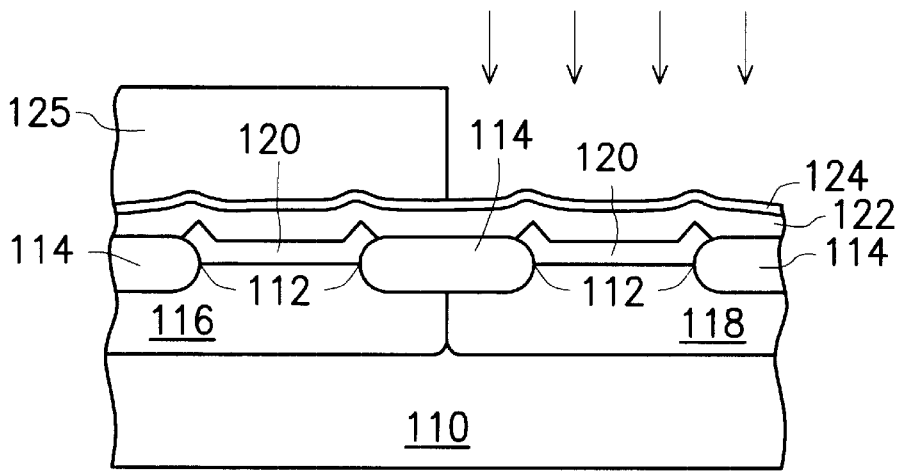

Referring further to FIG. 2C, in the subsequent step, a photoresist layer 125 is coated over the wafer in such a manner as to mask the part of the polysilicon layer 122 (FIG. 2B) above the P-well 116 while unmasking the part of the polysilicon layer 122 above the N-well 118. Then, with the photoresist layer 125 serving as mask, a second ion-implantation process is performed to dope ionized phosphorous at an energy of 50 KeV with a concentration of about $1.5 \times 10^{16}$ ions/cm$^2$ into the unmasked part of the polysilicon layer 122, whereby the unmasked part of the polysilicon layer 122 is converted into a heavily-doped region of the polysilicon layer, as here designated by the reference numeral 126 for distinguishing purposes, whereas the masked part of the polysilicon layer 122 remains as a lightly-doped region, as here designated by the reference numeral 128.

Figure 2D:
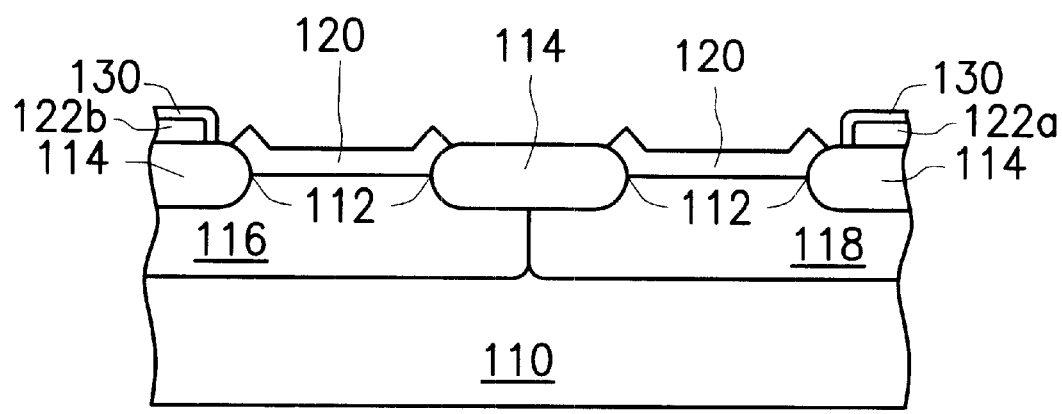

Referring next to FIG. 2D, in the subsequent step, the heavily-doped and lightly-doped regions 126, 128 are selectively removed in such a manner as to expose the silicon nitride layers 120. The remaining part 122$b$ of the lightly-doped region above the P-well 116 is then used as the intended resistor while the remaining part 122$a$ of the heavily-doped region above the N-well 118 is used as the intended capacitor electrode (more specifically, as the bottom electrode of a capacitor that is to be formed subsequently in the integrated circuit; the capacitor is not shown since the forming of the capacitor is not within the spirit and scope of the invention). Then, optionally, an oxide layer 130 can be formed over the remaining part 122$a$ of the heavily-doped region and the remaining part 122$b$ of the lightly-doped region for the purpose of protecting these layers 122$a$, 122$b$ during the subsequent removal of the silicon nitride layers 120 through etching. The oxide layer 130 can be formed by, for example, performing a thermal oxidation process at a temperature of about 850° C. in an oxygen environment.

Figure 2E:
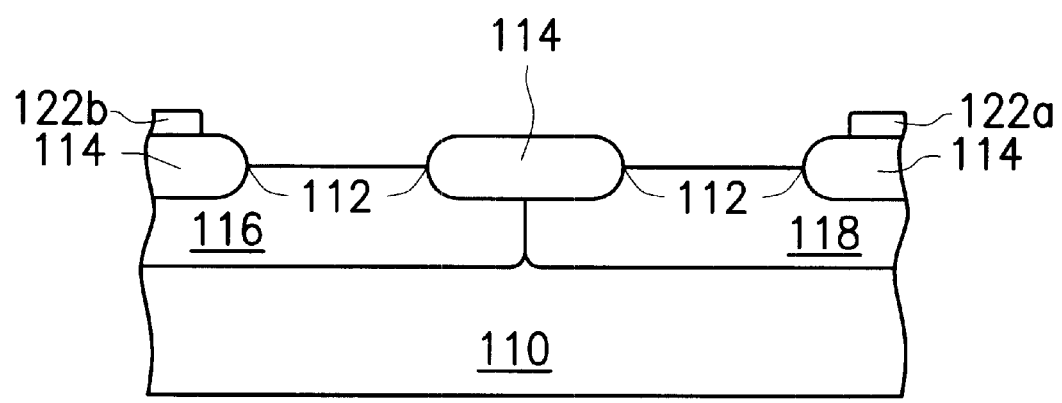

Referring next to FIG. 2E, in the subsequent step, all the silicon nitride layers 120 are removed by, for example, performing a wet-etching process. Next, the oxide layer 130 is removed. The removal of the oxide layer 130 can be performed along with the removal of the pad oxide layer (not shown) formed between the substrate 110 and the silicon nitride layer 120. This completes the fabrication of the resistor (i.e., the part 122$b$ of the lightly-doped region) and the capacitor electrode (i.e., the part 122$a$ of the heavily-doped region) over the substrate 110. The subsequent processes to complete the MOS transistor and the capacitor can be the same as conventional processes. Since these subsequent processes are not within the spirit and scope of the invention, they are not shown and described in this specification.

It can be learned from the foregoing description that the method of the invention has the following advantages over the prior art.

First, since the silicon nitride layers 120 are removed after the resistor and the capacitor electrode are readily formed, the silicon nitride layers 120 can help prevent the bombarding ions used in the ion-implantation process and the plasma used in the etching process to cause damage to the substrate 110.

Second, the provision of the oxide layer 124 can help prevent the particles and metals from the implantation machine from contaminating the substrate 110 during the ion-implantation processes.

Third, the provision of the oxide layer 130 over the part 122a of the heavily-doped region and the part 122b of the lightly-doped region can help protect these layers 122a, 122b during the subsequent removal of the silicon nitride layers 120 through etching.

The foregoing first and second features can help prevent the undesired decreases in the charge breakdown and the breakdown voltage of gate oxide of the gate oxide layer (not shown) subsequently formed over the substrate as in the case of the prior art. The subsequently formed gate oxide layer (not shown) can thus be more reliable.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a resistor and a capacitor electrode in an integrated circuit constructed on a semiconductor substrate that is already formed with a plurality of isolation structures defining a plurality of active regions with a silicon nitride layer being formed over each of the active regions, the method comprising the steps of:

forming a polysilicon layer covering all of the isolation structures and the active regions, wherein the polysilicon layer is partitioned by definition into a resistor part and an electrode part;

forming an oxide layer over the polysilicon layer;

performing a first ion-implantation process, wherein the ions penetrates through the oxide layer to convert the entire polysilicon layer into a lightly-doped polysilicon layer with a first impurity concentration;

performing a second ion-implantation process solely on the electrode part of the polysilicon layer so as to convert the electrode part of the polysilicon layer into a heavily-doped polysilicon layer with a second impurity concentration being higher than the first impurity concentration, wherein the ions penetrates through the oxide layer; and performing a selective removal process to remove selected parts of the lightly-doped polysilicon layer and the heavily-doped polysilicon layer in such a manner as to expose all the silicon nitride layers, with the remaining part of the lightly-doped polysilicon layer serving as the intended resistor and the remaining part of the heavily-doped polysilicon layer serving as the intended capacitor electrode.

2. The method of claim 1, further comprising the step of removing the silicon nitride layers after the selective removal process to remove process to remove selected parts of the lightly-doped polysilicon layer and the heavily-doped polysilicon layer is completed.

3. The method of claim 1, wherein the polysilicon layer is formed through an LPCVD process.

4. The method of claim 1, wherein the first ion-implantation process is performed in such a manner as to dope ionized phosphorous at an energy of 50 KeV with a concentration of $6 \times 10^{15}$ ions/cm$^2$.

5. The method of claim 1, wherein the second ion-implantation process is performed in such a manner as to dope ionized phosphorous at an energy of 50 KeV with a concentration of $1.5 \times 10^{16}$ ions/cm$^2$.

6. The method of claim 1, wherein the selective removal process to remove selected parts of the lightly-doped polysilicon layer and the heavily-doped polysilicon layer is a masked dry-etching process.

7. A method for fabricating a resistor and a capacitor electrode in an integrated circuit constructed on a semiconductor substrate that is already formed with a plurality of isolation structures defining a plurality of active regions with a silicon nitride layer being formed over each of the active regions, the method comprising the steps of:

forming a polysilicon layer covering all of the isolation structures and the active regions, wherein the polysilicon layer is partitioned by definition into a resistor part and an electrode part;

forming a first oxide layer over the polysilicon layer;

performing a first ion-implantation process, wherein the ions penetrates through the first oxide layer to convert the entire polysilicon layer into a lightly-doped polysilicon layer with a first impurity concentration;

performing a second ion-implantation process solely on the electrode part of the polysilicon layer so as to convert the electrode part of the polysilicon layer into a heavily-doped polysilicon layer with a second impurity concentration being higher than the first impurity concentration, wherein the ions penetrates through the oxide layer; and performing a selective removal process to remove selected parts of the lightly-doped polysilicon layer and the heavily-doped polysilicon layer in such a manner as to expose all the silicon nitride layers;

forming a second oxide layer covering the entire remaining part of the lightly-doped polysilicon layer and the entire remaining part of the heavily-doped polysilicon layer;

removing the silicon nitride layers; and removing the second oxide layer, the remaining part of the lightly-doped polysilicon layer serving as the intended resistor and the remaining part of the heavily-doped polysilicon layer serving as the intended capacitor electrode.

8. The method of claim 7, wherein the polysilicon layer is formed through an LPCVD process.

9. The method of claim 7, wherein the first ion-implantation process is performed in such a manner as to dope ionized phosphorous at an energy of 50 KeV with a concentration of $6 \times 10^{15}$ ions/cm$^2$.

10. The method of claim 7, wherein the second ion-implantation process is performed in such a manner as to dope ionized phosphorous at an energy of 50 KeV with a concentration of $1.5 \times 10^{16}$ ions/cm$^2$.

11. The method of claim 7, wherein the second oxide layer is formed by performing an annealing process on the lightly-doped polysilicon layer and the heavily-doped polysilicon layer at a temperature of 850° C. in an oxygen environment.

12. The method of claim 7, wherein the selective removal process to remove selected parts of the lightly-doped polysilicon layer and the heavily-doped polysilicon layer is a masked dry-etching process.

* * * * *